(12) United States Patent
Tews

(10) Patent No.: US 6,756,254 B2
(45) Date of Patent: Jun. 29, 2004

(54) INTEGRATED CIRCUIT HAVING AN ANTIFUSE AND A METHOD OF MANUFACTURE

(75) Inventor: Rene Tews, Dresden (DE)

(73) Assignee: Infineon Technologies AG, Münich (DE)

( * ) Notice: Subject to any disclaimer, the term of this patent is extended or adjusted under 35 U.S.C. 154(b) by 0 days.

(21) Appl. No.: 10/135,580

(22) Filed: Apr. 30, 2002

(65) Prior Publication Data

US 2002/0173132 A1 Nov. 21, 2002

(30) Foreign Application Priority Data

Apr. 30, 2001 (DE) .......................................... 101 21 240

(51) Int. Cl.[7] .............................................. H01L 21/82
(52) U.S. Cl. ...................... 438/131; 438/600; 438/601; 438/630; 257/530; 257/50; 257/209
(58) Field of Search ................................ 438/131, 600, 438/630, 664, 649, 655, 132, 128, 129, 130, 210, 601; 257/530, 752, 754, 763, 50, 209

(56) References Cited

U.S. PATENT DOCUMENTS

| | | |
|---|---|---|
| 4,128,670 A | 12/1978 | Gaensslen |
| 5,565,702 A | 10/1996 | Tamura et al. |
| 5,693,556 A * | 12/1997 | Cleeves ......................... 437/60 |
| 5,780,323 A * | 7/1998 | Forouhi et al. .............. 438/131 |
| 5,780,919 A * | 7/1998 | Chua et al. .................. 257/530 |
| 5,866,938 A * | 2/1999 | Takagi et al. ................ 257/530 |
| 5,904,507 A * | 5/1999 | Thomas ....................... 438/131 |
| 5,907,183 A * | 5/1999 | Takeuchi ..................... 257/640 |
| 6,097,077 A * | 8/2000 | Gordon et al. .............. 257/530 |
| 6,118,135 A * | 9/2000 | Gonzalez et al. ............... 257/3 |
| 6,225,157 B1 * | 5/2001 | Thakur et al. ............... 438/240 |
| 6,249,010 B1 * | 6/2001 | Bergemont et al. ........... 257/50 |
| 6,344,373 B1 * | 2/2002 | Bhattacharyya et al. .... 438/131 |

OTHER PUBLICATIONS

Patent Abstract and translation of Published Japanese Application 0512155A of May 18, 1993.
Article by Widmann et al from *Technologie hochintegrierter Schaltungen*, 2nd Edition, Springer, 1996, pp. 82–87.

* cited by examiner

*Primary Examiner*—Renzo Rocchegiani
(74) *Attorney, Agent, or Firm*—Schiff Hardin LLP

(57) ABSTRACT

An integrated circuit is formed by a method having the steps of providing a circuit substrate with a first metallized region, providing a first insulation layer covered by a silicon layer, patterning the first insulation layer and silicon layer to form a first insulation region and first silicon region, then forming a second metallized layer on the silicon region, heating the material so that the second metal layer diffuses into the silicon layer to form a metal silicide region, which is subsequently covered by a second insulating layer having a contact with an interconnect to enable contacting an antifuse formed by the metal silicide region.

8 Claims, 3 Drawing Sheets

US 6,756,254 B2

INTEGRATED CIRCUIT HAVING AN ANTIFUSE AND A METHOD OF MANUFACTURE

BACKGROUND OF THE INVENTION

The present invention is directed to a method for fabricating integrated circuit having an antifuse and to an integrated circuit with the antifuse.

U.S. Pat. No. 5,780,323, whose disclosure is incorporated herein by reference thereto, discloses a method for fabricating an integrated circuit in which an antifuse structure is formed. For this purpose, a dielectric stack is provided on a first metallization region. As its uppermost layer, the dielectric stack contains an amorphous silicon layer, often referred to as an a-silicon layer. After depositing of the dielectric interlayer, a contact hole is etched and a metal layer is deposited above the resulting structure, forming a boundary surface with the a-silicon layer of the dielectric stack. After a conditioning process, the a-silicon layer of the dielectric stack is converted into a metal silicide layer.

U.S. Pat. No. 5,565,702, whose disclosure is incorporated herein by reference thereto, discloses an antifuse structure and a corresponding fabrication method. In this known method, first, a dielectric interlayer is deposited above a first metallization region, and then the contact holes are provided therein. The antifuse structures are formed in the contact holes.

A similar method is disclosed in Japanese 5-121555 A. U.S. Pat. No. 4,128,670, whose disclosure is incorporated herein by reference thereto, and an article by D. Widmann et al, *Technologie hochintegrierter Schaltung* (*Large-scale integrated circuit technology*), 2nd Edition, Springer, 1996, pp. 82–87, disclose the fabrication of silicide layers by depositing metal layers and silicon layers over the entire surface.

Although it can, in principle, be applied to any desired integrated circuits, the present invention and the problem on which it is based are explained in connection with integrated circuits produced using silicon technology.

FIGS. 2a–2d diagrammatically depict various process steps involved in a known method for fabricating an integrated circuit using silicon technology.

In FIG. 2a, an insulation layer 2 comprising silicon dioxide is provided on an integrated circuit (not shown) and two metallization regions 10a and 10b of tungsten have been formed in this insulation layer. The introduction of the metallization regions 10a and 10b can be achieved, for example, by following a trench etching technique, depositing tungsten over the entire surface above the silicon dioxide layer 2 and then removing the tungsten by chemical and mechanical polishing in such a manner that the separate metallization regions 10a and 10b are formed.

The intention of the method shown is to allow, in addition to the standard tungsten contacts on the first metallization region 10a, a second type of contact also to be created, in which a functional layer 15 rests on top of the second metallization region 10b, with which contact is made from above by a contact. In the present case, the functional layer serves as a fusible link or antifuse and consists of $SiN/WSi_X$. However, it could also be a metallic barrier layer or the like.

As shown in FIG. 2b, in a subsequent process step, the functional layer 15 of $SiN/WSi_X$ is deposited above the resulting structure, so that it covers the first and second metallization regions 10a and 10b. In a subsequent process step, a photomask 20 is formed in such a manner that it covers the functional layer 15 over the second metallization region 10b but leaves the functional layer 15 above the first metallization region 10a clear.

Then, as shown in FIG. 2c, an etching process and a resist-stripping operation take place, for example in an $NF_3$-containing plasma, in order to remove the exposed portions of the functional layer 15 above the first metallization region 10a. During this etching operation and during the stripping of the resist, an oxide film 100 comprising $WO_X$ is formed above the tungsten of the first metallization region 10a. A disadvantage is that it is impossible to avoid the formation of the $WO_X$ layer of this type and, consequently, the contact resistance between the contact 11a, which is to be formed later, and the first metallization region 10a is undesirably increased.

As shown in FIG. 2d, following the preceding process step, an insulation layer 25 of, for example, silicon dioxide, is deposited over the entire surface of the resulting structure. Then, contact holes 12a and 12b are formed above the first and second metallization regions 10a and 10b, respectively, and these holes are filled with contacts 11a and 11b consisting of tungsten. This filling with the contacts can be effected in a similar manner to the formation of the first and second metallization regions 10a and 10b by depositing tungsten over the entire surface of the structure, including the contact holes 12a and 12b, and then partially removing this tungsten again by chemical, mechanical polishing.

A fusible link or antifuse, as is also known from U.S. Pat. No. 5,780,323, is illustrated in FIG. 3 and includes a function layer 30 of amorphous silicon which is deposited above the level of the contact hole 12 comprising the contact 11 and is patterned. After the step of patterning, an interconnect 40 is provided above the resulting structure and this interconnect can be used to blow the fusible link The fact that the layer 30 of amorphous silicon has a considerable thickness and, therefore, requires high voltages and currents in order to be blown, has proven to be a drawback of this type of structure.

An important property of a continuous, i.e., programmed dielectric antifuse structure, consists in low contact resistance of the structure. Excessively high contact resistance causes two problems:

a) the contrast between the high resistance of an antifuse which is not short-circuited and the low resistance of a short-circuited antifuse is too small, which may lead to a read-out error when analyzing the state of the antifuse; and b) the time constant when reading out the antifuse is too great, which lengthens access time to the part of the circuit selected by the antifuse.

SUMMARY OF THE INVENTION

It is an object of the present invention to provide a method for fabricating an integrated circuit and a corresponding integrated circuit in which the contact resistance is reduced. According to the invention, this object is achieved by a fabrication method comprising the steps of preparing a circuit substrate, providing a first metallization region comprising a first metal in the circuit in the substrate, depositing a first insulation layer over the entire surface of the substrate, providing a silicon layer on the first insulation layer, jointly patterning the silicon layer and the first insulation layer to form a stack comprising a first insulation region and the silicon region above the first metallization region, depositing a second metallization layer over the patterned first insulation region and silicon region, conditioning the stack to create a metal silicide out of the silicon region and the second metallization layer over the silicon region to form a conductive region, then etching the second metallization layer to remove that layer that remains laterally next to the conductive region of the metal silicide, providing a second insulating region above the first insulation region and the conductive region, forming a contact in the second insulation region in order to make contact with the conductive region and providing an interconnect for connection to the contact.

Thus, the method produces an integrated circuit having a circuit substrate with a first metallization region comprising a first metal in the circuit substrate, a first insulation region above the first metallization region, a conductive region comprising a metal silicide above the first insulation region, a second insulation region above the first insulation region and conductive region, a contact in the second insulation region and an interconnect for the contact.

The idea on which the present invention is based consists in the conductive region comprising a metal silicide being fabricated by providing a stack comprising a silicon region and a second metallization region above the first insulation region and then conditioning the stack. It is proposed for the upper contact layer of the antifuse stack to be fabricated from metal suicides of better conductivity, preferably NiSi, TiSi or CoSi. Suitable heat treatments can set the structure of these material systems in such a manner that the resistance becomes minimal. Typical values for the specific resistance of this metal silicide lies in the range of between 10 and 30 $\mu$Ohmcm. In a particularly preferred embodiment, the lower interconnect level consists of tungsten, the insulating layer consists of silicon nitride and the conductive antifuse layer consists of NiSi, TiSi or CoSi, and the upper contact with an aluminum interconnect consists of tungsten.

Compared to the known attempted solution, the fabrication method according to the invention has the advantage that the integrated circuit, in particular an antifuse structure with reduced contact resistance, can easily be fabricated.

According to a further preferred refinement, the metal silicide is provided stoichiometrically as a result of the stack comprising a silicon region and the second metallization region being fabricated with a defined thickness ratio and maximum temperature during conditioning not exceeding a predetermined value.

According to a further preferred refinement, the metal silicide includes NiSi, TiSi or CoSi.

According to a further preferred refinement, the first insulation region consists of $Si_3N_4$, $SiO_2$ or combinations thereof.

Other advantages and features of the invention will be readily apparent from the following description of the preferred exemplary embodiment, the drawings and claims.

DESCRIPTION OF THE PREFERRED EMBODIMENTS

Figure 1A:
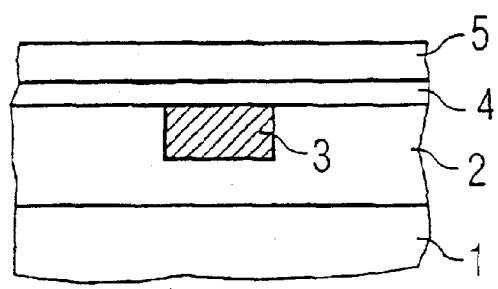
FIGS. 1a–1f are diagrammatic cross-sectional views of various process steps involved in the method for fabricating an integrated circuit using silicon technology in accordance with the present invention.
Figure 1B:
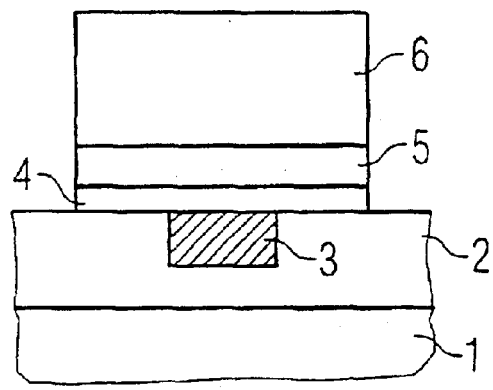
Figure 1C:
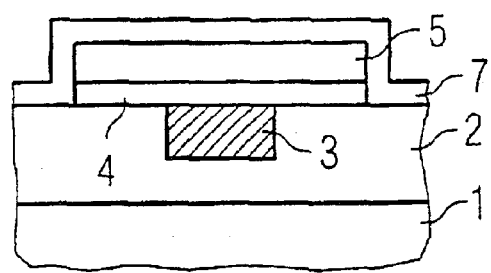

For the purposes of promoting an understanding of the principles of the invention, reference will now be made to the preferred embodiment illustrated in the drawings and specific language will be used to describe the same. It will, nevertheless, be understood that no limitation of the scope of the invention is thereby intended, such alternations and further modifications in the illustrated device and/or method, and such further applications of the principles of the invention as illustrated therein being contemplated as would normally occur now or in the future to one skilled in the art to which the invention relates.

In the Figures, identical reference symbols denote identical components or components which have an identical function.

The principles of the present invention are particularly useful when incorporated in a process diagrammatically illustrated in FIGS. 1a–1f for fabricating an integrated circuit using silicon technology.

In the method for fabricating an integrated circuit according to the illustrated embodiment, a circuit substrate 1 is prepared having an insulation layer 2 of $SiO_2$, in which, then, a metallization region 3 comprising a first metal, for example tungsten, is provided.

In particular, first of all, a circuit (not shown), which is integrated in the silicon substrate 1 is provided therein. The insulating silicon oxide layer 2 is deposited on the substrate 1. The interconnect region 3 is embedded in the oxide layer, specifically, for example, by providing a corresponding trench, depositing a layer of tungsten and then polishing the tungsten layer back to the surface of the oxide layer 2. In an additional method step, a silicon nitride layer 4 is deposited over the entire surface and, above this, a polysilicon layer 5 is then deposited above the resulting structure.

In the next step, a photoresist mask 6 (see FIG. 1b) is formed on the polysilicon layer 5, and the photoresist mask 6 is used to pattern the silicon nitride layer 4 and the polysilicon layer 5 together, specifically in such a way that they cover a certain region above the interconnect 3.

In a subsequent method step, after removal of the photoresist mask 6, a cobalt layer 7 is deposited conformally over the entire surface of the resulting structure. The cobalt layer 7 has a defined thickness ratio with respect to the polysilicon layer 5 therebelow.

Figure 1D:
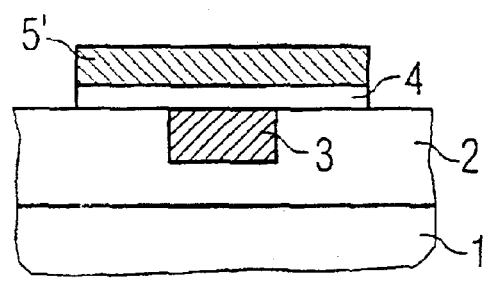

In a next step, a conditioning process takes place by heating at a predetermined temperature, for example, in the present case, at $\geq 500°$ C., which leads to the polysilicon layer 5 and the cobalt of the Co layer 7 comingling with one another by diffusion and ultimately converting the entire remaining polysilicon layer 5 into a cobalt silicide layer 5' which would be $Co_2Si$ or CoSi (see FIG. 1d). This is achieved, in particular, as a result of the predetermined thickness ratio and the predetermined temperature. The formation of this compound has ended as soon as stoichiometry is reached.

What remains, in addition to the silicon nitride layer 4 with the stoichiometric compound CoSi above it, is an excess of cobalt metal. This can be easily removed by selective etching without there being any need for a special masking and without undesirable undercut etching effects occurring. This selective etching of the remaining cobalt of the cobalt layer 7 results in the process stage, as shown in FIG. 1d.

Figure 1E:
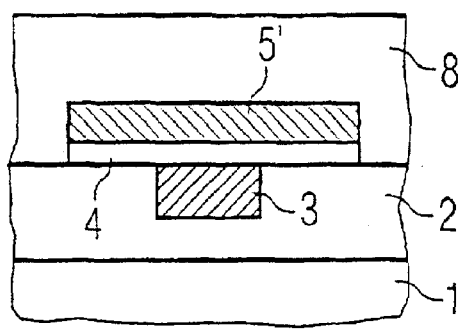

In the next, further step, an additional insulation layer of oxide 8 is deposited above the resulting structure, as shown in FIG. 1e.

Next, a contact hole 9a is formed in the insulation layer 8 in a known way and a tungsten contact 9 is formed in this contact hole to form an electrical connection to the conductive layer 5' comprising the stoichiometric metal silicide compound CoSi.

Figure 1F:
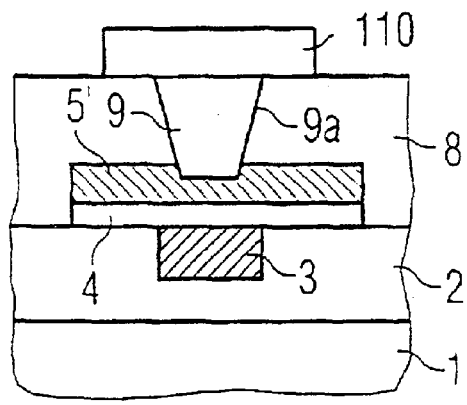
Figure 2A:
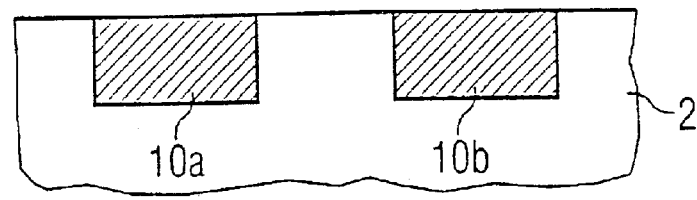
FIGS. 2a–2d are diagrammatic cross-sectional views of various process steps involved in a known method for fabricating an integrated circuit using silicon technology.
Figure 2B:
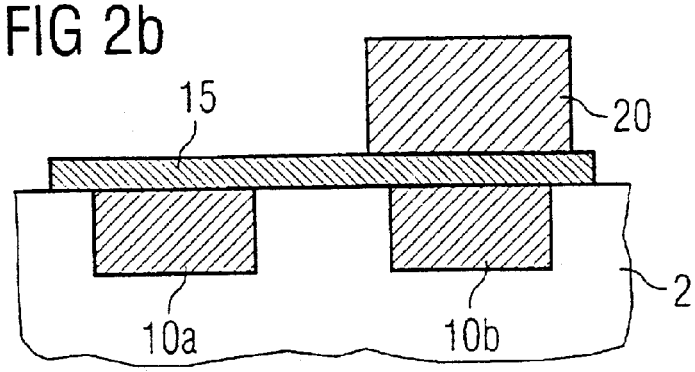
Figure 2C:
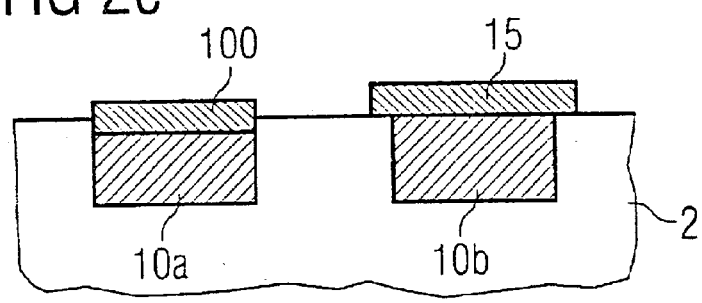
Figure 2D:
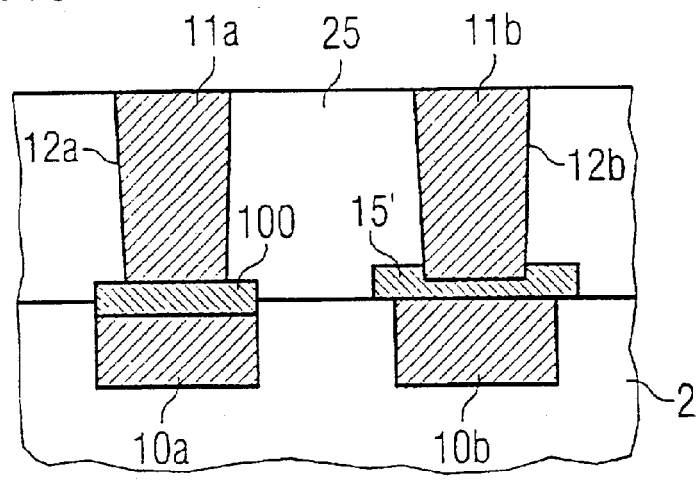
Figure 3:
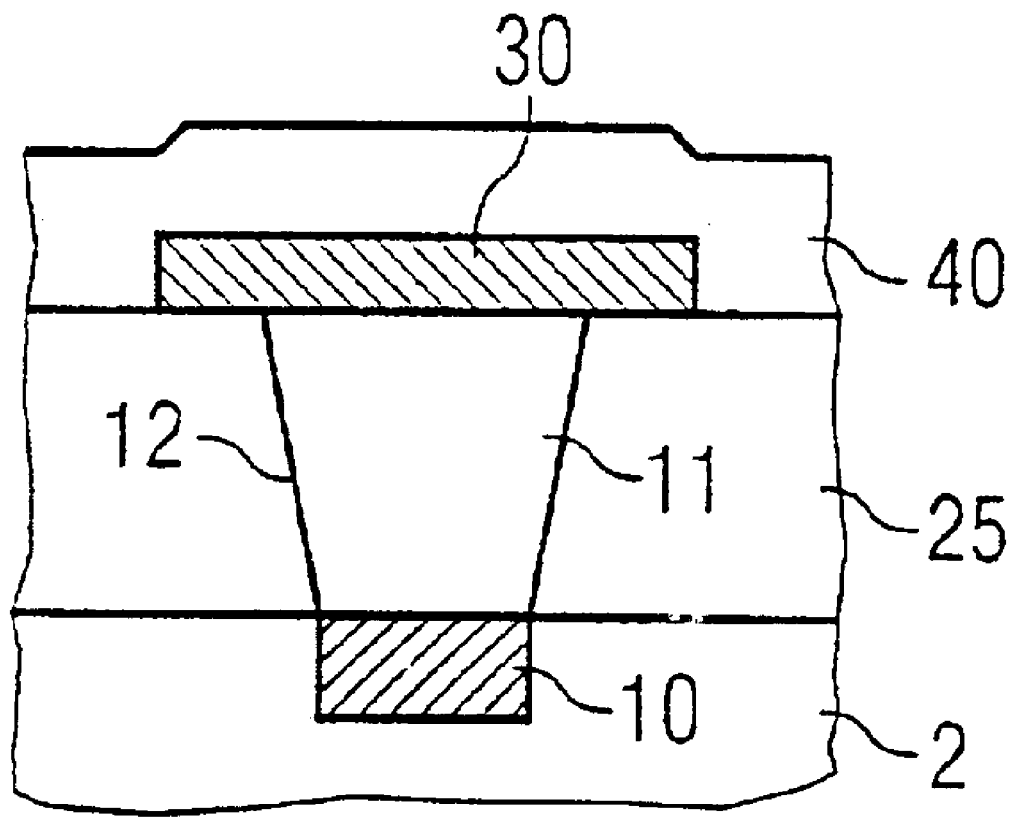
FIG. 3 shows an example of a known fusible link in which a functional layer of amorphous silicon is disposed above the level of the contact hole.

Next, an interconnect 110 of aluminum, which connects the antifuse structure fabricated in this manner to an external circuit (not shown), is formed, likewise in a known manner, above the tungsten contact 9. This results in a thin antifuse with a low contact resistance, which is illustrated in FIG. 1f.

Although the present invention has been described above with reference to a preferred exemplary embodiment, it is not restricted thereto, but, rather, can be modified in numerous ways. For example, the choice of metal materials is given purely by way of example and can be varied in many ways.

I claim:

1. A method for fabricating an integrated circuit, said method comprising the steps of preparing a circuit substrate; providing a first metallization region comprising a first metal in the circuit substrate; forming a first insulation layer over the entire surface of the circuit substrate region; forming a silicon layer on the first insulating layer; providing a mask overlying the first metallization region; patterning the first insulation layer and the silicon layer to form a stack of a first insulation region and a silicon region; forming a second metallization layer over the first insulation region and the silicon region; heating the stack so the metal of the second metallization layer and the silicon region diffuse together to convert the entire silicon region into a conductive region of metal silicide on the first insulation region; etching the laterally remaining second metallization layer to remove it, except in the conductive region of the metal silicide; providing a second insulation region above the first insulation region and the conductive region; forming a contact in the second insulation region in order to make contact with the conductive region and providing an interconnect for electrical connection to the contact.

2. A method according to claim 1, wherein the step of heating to convert the silicon region into a conductive region of metal silicide provides a metal silicide that is stoichiometric by controlling the thicknesses of the silicon region and the second metallization layer to have a defined thickness ratio and ensuring that the maximum temperature during heating does not exceed a predetermined value.

3. A method according to claim 2, wherein the metal silicide is selected from a group consisting of NiSi, TiSi or CoSi.

4. A method according to claim 3, wherein the first insulation region contains a material selected from $Si_3N_4$, $SiO_2$ and combinations of $Si_3N_4$ and $SiO_2$.

5. A method according to claim 1, wherein the metal silicide is selected from a group consisting of NiSi, TiSi and CoSi.

6. A method according to claim 1, wherein the first insulation region is a material selected from a group consisting of $Si_3N_4$, $SiO_2$ and combinations of $Si_3N_4$ and $SiO_2$.

7. A method according to claim 6, wherein the metal silicide is selected from a group consisting of NiSi, TiSi and CoSi.

8. A method according to claim 1, wherein the step of providing a first metallization comprises forming a trench in the circuit substrate and filling the trench until a metal of the first metallization.

* * * * *